US007475330B2

(12) United States Patent
Blankenship et al.

(10) Patent No.: US 7,475,330 B2
(45) Date of Patent: Jan. 6, 2009

(54) METHOD AND APPARATUS FOR GENERATING A PUNCTURED SYMBOL VECTOR FOR A GIVEN INFORMATION VECTOR

(75) Inventors: Yufei Wu Blankenship, Streamwood, IL (US); Brian K. Classon, Palatine, IL (US); Vipul A. Desai, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 218 days.

(21) Appl. No.: 11/466,926

(22) Filed: Aug. 24, 2006

(65) Prior Publication Data

US 2008/0049865 A1  Feb. 28, 2008

(51) Int. Cl.
*H03M 13/03* (2006.01)
(52) U.S. Cl. .................. 714/790; 714/702; 714/752
(58) Field of Classification Search .......... 714/786, 714/790, 702, 752
See application file for complete search history.

(56) References Cited

U.S. PATENT DOCUMENTS

| | | | | |
|---|---|---|---|---|
| 6,158,041 A * | 12/2000 | Raleigh et al. | ............. | 714/792 |
| 6,311,306 B1 * | 10/2001 | White et al. | ................ | 714/790 |
| 6,961,388 B2 * | 11/2005 | Ling et al. | .................. | 375/267 |
| 6,981,202 B2 * | 12/2005 | Mikkola et al. | ............. | 714/790 |
| 7,093,184 B2 * | 8/2006 | Kim et al. | ................... | 714/789 |
| 2005/0160349 A1 * | 7/2005 | Cheun et al. | ............... | 714/790 |

OTHER PUBLICATIONS

3GPP TS 25.212 v6.4.0 (Mar. 2005): Multiplexing and Channel Coding (FDD) (Release 6).
IEEE Std 802.16-2004, "Part 16: Air Interface for Fixed and Mobile Broadband Wireless Access Systems," Oct. 2004.
Motorola, TSGR1-01-1014, "A new Hybrid-ARQ scheme using incremental redundancy," Sophia Antipolis, France, Nov. 5-7, 2001.

* cited by examiner

*Primary Examiner*—Esaw T Abraham

(57) ABSTRACT

A method and apparatus for encoding and decoding data is described herein. During operation, data enters a convolutional encoder (101). The encoder encodes the information bits from the data at encoding rate ($1/R_0$) to produce data symbols vectors $P_0, P_1, \ldots, P_{R0}$. Vectors $P_1, \ldots, P_{R0}$ are each interleaved separately to form vectors $P_0', P_1', \ldots, P_{R0}'$. A multiplexer (105) multiplexes $P_0', P_1', \ldots, P_{R0}'$ to produce vector Q. The multiplexed interleaved symbols Q are input into symbol adder/remover (107) where appropriate symbols are added or removed to match an over-the-channel transmission rate. Finally, vector Q' is transmitted via over-the-channel transmission.

16 Claims, 3 Drawing Sheets

100

200

METHOD AND APPARATUS FOR GENERATING A PUNCTURED SYMBOL VECTOR FOR A GIVEN INFORMATION VECTOR

FIELD OF THE INVENTION

The present invention relates generally to encoding and decoding data and in particular, to a method and apparatus for generating a punctured symbol vector for a given information vector.

BACKGROUND OF THE INVENTION

Digital data transmissions over wired and wireless channels sometimes may be corrupted, for instance, by noise in the link or channel, by interference from other transmissions, or by other environmental factors. Even with clear communication channels, which lend themselves to high data rates, it may not be possible to appropriately decode the data stream with the requisite error rates. In order to solve this problem, many communication systems employ error-correction techniques to aid in communication.

One technique utilized for error correction is the convolutional coding of information to be transmitted. Utilizing such a technique, an encoder will encode the information bits from an information vector into data symbols at a fixed encoding rate with an encoding algorithm which facilitates subsequent decoding of the data symbols into information bits (e.g., maximum a posteriori decoding algorithms, maximum likelihood decoding algorithms). Generally, information bits are encoded using a rate $1/R_0$ mother code. Since over-the-channel transmission rates may differ from the encoding rate, the encoded data needs to be modified to match the over-the-channel transmission rate. Prior art techniques for matching the rate of encoding to the over-the-channel transmission rate have used an appropriate puncturing pattern.

For example, the encoded data symbols from a rate ½ (i.e., $R_0=2$) mother code may be divided into groups of 6 (corresponding to 3 information bits). Then a puncturing pattern of (1, 0, 1; 1, 1, 0) is applied to each group to achieve an over-the-channel rate of ¾, where a '1' indicates that the encoded symbol is retained while a '0' indicates that the encoded symbol is punctured (i.e., not transmitted). Although this puncturing pattern is fairly simple, puncturing patterns can often be fairly complicated for different rates (e.g., rate 0.4177). Puncturing patterns are typically generated by exhaustive searches that match each combination of data rate, the encoding rate, and over-the-channel transmission rate. As a result, introducing new data rates, encoding rates, or over-the-channel transmission rates into a communication system can be difficult.

Furthermore, prior art techniques for puncturing often complicate the implementation of incremental redundancy (IR) hybrid automatic repeat request (HARQ). With incremental redundancy, the information bits are re-transmitted where each transmission corresponding to the same information vector may use a different puncturing pattern. Because puncturing patterns may overlap, there may be a loss in performance with incremental redundancy. For example, assuming a rate ½ mother code (i.e., encoding rate=½), the first transmission uses a rate ⅘ puncturing pattern of (1, 1, 0, 1; 0, 1, 0, 1). If the second transmission uses a puncturing pattern of (0, 0, 1, [21 zeros]), then the first and the second transmission can be combined to form a rate ¾ code. However, if the second transmission uses the (1, [23 zeros]) pattern, then IR degenerates into partial Chase combining, resulting in performance loss. In addition, this example requires the information block size to be a multiple of 12 to achieve the exact code rate of ⅘ after the first transmission, and rate ¾ after the second transmission. This example illustrates the inflexibility of the puncturing pattern approach in providing the required code rate for forward error correction (FEC) and IR systems.

Although several methods exist to solve the rate matching problem for turbo codes, the same methods cannot be applied to convolutional codes. For example, the IEEE 802.16 standard contains a rate-matching procedure for turbo codes. The turbo encoder takes an information stream and produces a systematic stream and an even number of parity streams. Half of the parity streams are produced using a turbo interleaved version of the information stream. The rate-matching arranges the bits in the streams in a manner suitable for iterative turbo decoding by (a) rearranging the bits in each stream using additional (identical) block interleavers and (b) giving the information stream higher priority for transmission. However, a convolutional code may not even produce an information stream, and even if it does produce an information stream, the performance may be degraded if the information stream is prioritized. Therefore, a need exists for a method and apparatus for generating a punctured symbol vector for a given information vector for convolutional codes.

DETAILED DESCRIPTION OF THE DRAWINGS

Figure 1:
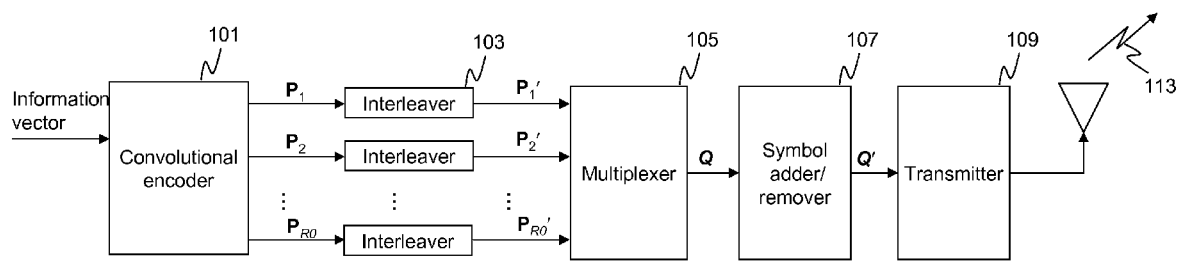
FIG. 1 is a block diagram of a transmitter.

In order to address the above-mentioned need, a method and apparatus for encoding and decoding data is described herein. During operation, data represented by an information vector enters a convolutional encoder. The encoder encodes the information bits from the information vector at encoding rate $(1/R_0)$ to produce data symbol vectors $P_1, P_2, \ldots, P_{R0}$. Vectors $P_1, P_2, \ldots, P_{R0}$ are each interleaved separately to form vectors $P_1', P_2', \ldots, P_{R0}'$. A multiplexer multiplexes $P_1', P_2', \ldots, P_{R0}'$ to produce vector Q. The multiplexed interleaved symbol vector Q is input into a symbol adder/remover where appropriate symbols are added or removed to match the over-the-channel transmission rate, forming vector Q'. Vector Q' contains substantially equal number of symbols from each vector $P_i'$, $i=1, 2, R_0$. Finally, vector Q' is transmitted over the channel.

The above-described rate matching algorithm provides good performance for various data rates, encoding rates and over-the-channel transmission rates. Compared to using a puncturing pattern, the above-described technique has the advantage of flexibility and fine granularity in that any target code size can be easily achieved for any combination of data rate and encoding rate. Compared to existing rate matching algorithms, it also has the advantage of simplicity.

The present invention encompasses a method for operating a transmitter. The method comprises the steps of encoding an information vector to produce data symbol vectors $P_1, P_2, \ldots, P_{R0}$, interleaving vectors $P_1, \ldots, P_{R0}$ to produce vectors $P_1', P_2', \ldots, P_{R0}'$, wherein each vector $P_1, \ldots, P_{R0}$ is interleaved separately, and multiplexing vectors $P_1', P_2', \ldots, P_{R0}'$ to produce vector Q. Symbols are added or removed from Q to form a vector Q' having a rate that matches an over-the-channel transmission rate. Q' comprises substantially equal number of symbols from each vector $P_i'$, $i=1, 2, \ldots, R_0$. Finally, vector Q' is transmitted over-the-channel.

The present invention additionally encompasses a method for operating a receiver that estimates an information vector. The method comprises the steps of receiving a signal vector Q' over-the-channel. Vector Q' comprises substantially equal number of symbols from each vector $P_i'$, $i=1, 2, \ldots, R_0$. Symbols are added or removed from Q' to form a vector Q and then vector Q is de-multiplexed to produce a plurality of vectors $P_1', P_2', \ldots, P_{R0}'$. Vectors $P_1', P_2', \ldots, P_{R0}'$ are de-interleaved to produce vectors $P_1, \ldots, P_{R0}$, where each vector $P_1', P_2', \ldots, P_{R0}'$ is de-interleaved separately. Finally $P_1', P_2', \ldots, P_{R0}'$ is decoded to produce the estimated information vector.

The present invention additionally encompasses an apparatus comprising an encoder encoding an information vector to produce data symbol vectors $P_1, P_2, \ldots, P_{R0}$, at least one interleaver for interleaving vectors $P_1, \ldots, P_{R0}$ to produce vectors $P_1', P_2', \ldots, P_{R0}'$, a multiplexer multiplexing vectors $P_1', P_2', \ldots, P_{R0}'$ to produce vector Q, a symbol adder/remover adding or removing symbols from Q to form a vector Q' having a rate that matches an over-the-channel transmission rate, and a transmitter transmitting vector Q' over-the-channel.

The present invention additionally encompasses an apparatus comprising a receiver receiving vector Q' over-the-channel, a symbol adder/remover adding or removing symbols from Q' to form a vector Q, a de-multiplexer de-multiplexing vector Q to produce a plurality of vectors $P_1', P_2', \ldots, P_{R0}'$, at least one de-interleaver de-interleaving $P_1', P_2', \ldots, P_{R0}'$ to produce vectors $P_1, \ldots, P_{R0}$, and a decoder decoding $P_1, P_2, \ldots, P_{R0}$ to produce an estimated information vector.

Turning now to the drawings, wherein like numerals designate like components, FIG. 1 is a block diagram of a transmitter 100 utilized for data transmission. As shown, transmitter 100 comprises convolutional encoder 101, a plurality of (at least one) interleavers 103 (only one labeled), a multiplexer 105, a symbol adder/remover 107, and transmission circuitry 109.

During operation data represented by an information vector of length K enters convolutional encoder 101. Encoder 101 will encode the information bits from the information vector into data symbols at a fixed encoding rate (e.g., 1 bit in for every $R_0$ symbols out) with an encoding algorithm which facilitates subsequent decoding of the received data symbols into information bit estimations. Encoder 101 determines an encoding rate ($1/R_0$) for the data and encodes the information bits into data symbols at the fixed encoding rate with a convolutional encoding algorithm. For example, if $R_0=3$, convolutional encoder 101 is a rate ⅓ convolutional encoder and encodes the input information vector (at a rate of x Kbit/second) at a fixed encoding rate of one data bit to $R_0=3$ data symbols (i.e., rate ⅓) such that convolutional encoder 101 outputs data symbols at a rate of $R_0 * x$ ksymbol/second rate with a coded packet size of $R_0 * K$. The encoder 101 produces $R_0$ symbol streams $P_1, P_2, \ldots, P_{R0}$. Note that terminology "streams" and "vectors" can be used interchangeably. In one example convolutional encoder 101 implements a non-systematic non-recursive convolutional code, where all the symbol vectors $P_1, P_2, \ldots, P_{R0}$ are parity vectors, not equal to the information vector. A parity vector can be produced from a tap delay line operating on the information vector. In another example convolutional encoder 101 implements a systematic recursive convolutional code, where one symbol vector is the systematic vector, equal to the information vector. For the present invention, if a systematic stream is generated, it is treated in the same manner as a parity stream. In the receiver, a systematic vector corresponds to the transmitted information vector (e.g., a one-to-one mapping) while a parity vector does not correspond to the transmitted information vector.

The $R_0$ symbol streams are each input into interleavers 103 (which may be the same or different interleavers). Interleavers 103 interleave the data symbols at the symbol level to produce $R_0$ interleaved symbol streams $P_1', P_2', \ldots, P_{R0}'$. In a preferred embodiment the interleaver for $P_i$ is different from the interleaver for $P_j$, for certain $i \neq j$, $1 \leq i$, $j \leq R_0$. In a first embodiment of the present invention the interleavers 103 are each represented by a matrix, with symbol streams $P_0$, $P_1, \ldots, P_{R0}$ individually input into locations within a matrix so that the matrix is filled in a column by column manner. Symbols are individually output from locations within the matrix so that the matrix is emptied in a row by row manner, where the rows may have been permuted.

Thus, $P_1$ enters a first interleaver 103 and is interleaved to produce $P_1'$, while $P_2$ enters a second interleaver 103 and is interleaved to produce $P_2'$. The interleaved symbol streams $P_1', P_2', \ldots, P_{R0}'$ are output by interleavers 103 at the same data symbol rate that they were input (e.g., x ksymbol/second rate). The predetermined size of the block of data symbols defined by the matrix can be derived from the maximum number of data symbols which can be transmitted at a predetermined symbol rate within a predetermined length transmission block.

Interleaved symbol streams $P_1', P_2', \ldots, P_{R0}'$ are output from each interleaver at a rate of x ksymbol/second, and enter multiplexer 105 where they are multiplexed to produce vector Q. In a first embodiment of the present invention, vector $Q=[P_1'(1), P_2'(1), \ldots, P_{R0}'(1), P_1'(2), P_2'(2), \ldots, P_{R0}'(2), \ldots, P_1'(K), P_2'(K), \ldots, P_{R0}'(K)]$, where K is the length of the information vector. In another embodiment, $Q=[P_1'(1), P_1'(2), P_2'(1), P_2'(2), \ldots, P_{R0}'(1), P_{R0}'(2), P_1'(3), P_1'(4), P_2'(3), P_2'(4), \ldots, P_{R0}'(3), P_{R0}'(4), \ldots, P_1'(K-1), P_1'(K), P_2'(K-1), P_2'(K), \ldots, P_{R0}'(K-1), P_{R0}'(K)]$, where K is a length of the information vector. Vector Q is output from multiplexer 105 at a symbol rate of $R_0 * x$ ksymbol/second. Alternative multiplexing methods may be chosen to improve performance and/or to simplify implementation.

As discussed above, since over-the-channel transmission rates may differ from $R_0 * x$ ksymbol/second, the encoded data needs to be modified to match the over-the-channel transmission rate. Because of this, the multiplexed interleaved symbols in Q are input into symbol adder/remover 107 where appropriate symbols are added or removed to match the over-the-channel transmission rate. For example, if $N_c$ symbols need to be transmitted, $N_c$ consecutive symbols will be taken from sequence Q starting at position $L_i$. If $(L_i+N_c-1)$ is greater than the length $R_0 * K$ of Q, the extraction wraps around and will take symbols from the beginning of sequence Q. By varying $L_i$, a different part of Q will be extracted. Thus vector Q' is produced by adding or removing symbols from vector Q.

The multiplexing method used to produce vector Q in multiplexer 105 allows Q' to have a substantially equal number of symbols from the interleaved symbol streams $P_1'$, $P_2', \ldots, P_{R0}'$. Substantially equal means that the same or approximately the same number of symbols is used. For example, when vector Q is $[P_1'(1), P_2'(1), P_3'(1), P_1'(2), P_2'(2), P_3'(2), \ldots, P_1'(K), P_2'(K), P_3'(K)]$, taking $N_c=9$ symbols from Q with $L_i=1$ and $R_0=3$ produces Q' with substantially equal number of symbols {3 symbols from $P_1'$, 3 symbols from $P_2'$, and 3 symbols from $P_3'$}. In another example, $Q=[P_1'(1), P_1'(2), P_2'(1), P_2'(2), P_3'(1), P_3'(2), P_1'(3), P_1'(4), P_2'(3), P_2'(4), P_3'(3), P_3'(4), \ldots, P_1'(K-1), P_1'(K), P_2'(K-1), P_2'(K), \ldots, P_3'(K-1), P_3'(K)]$, taking $N_c=20$ symbols from Q with $L_i=1$ and $R_0=3$ produces Q' with substantially equal number of symbols {8 symbols from $P_1'$, 6 symbols from $P_2'$, and 6 symbols from $P_3'$}.

Typically, the value of the position $L_i$ may depend on the number of re-transmissions allowed in an incremental redundancy scheme. For example, in a first transmission, $L_i$ may be 1. In subsequent re-transmissions, the value of $L_i$ may be chosen to maximize performance. Often the value of $L_i$ may be related to the previous value of $L_i$ and the previous over-the-channel transmission rate. For instance, $L_{i+1}=1+[(L_i+N_c-1) \bmod(R_0*K)]$, where $\bmod(x)$ is the modulus function. Although the description here uses the same size $N_c$ for each re-transmission, it is clear that a different value of $N_c$ can be used for each (re-)transmission. In one embodiment, no overlap (repetitions) of the symbols in any adjacent transmissions occurs unless all $R_0*K$ symbols of Q have been selected. In another embodiment, some overlap may occur. When $N_c$ is greater than $R_0*K$, several copies (repetitions) of the same symbol will be transmitted within one transmission. For example, with $L_i=1$ and $N_c=\frac{3}{2}*R_0*K$, the output of the symbol adder/remover 107 is $Q'=[Q(1), Q(2), \ldots, Q(R_0*K), Q(1), Q(2), \ldots, Q(R_0*K/2)]$, (i.e., the first half of multiplexed interleaved symbols Q will be repeated.) Finally, vector Q' is passed to transmission circuitry 109 where it is transmitted via over-the-channel transmission 113, having a symbol rate of at most $R_0*x$ ksymbol/second, assuming $N_c \leq R_0*K$ and no other symbols are added in symbol adder/remover 107. Transmission circuitry 109 preferably comprises common circuitry known in the art for transmitting utilizing a well known communication protocol, and serve as means for modulating and transmitting symbols to a receiver. For example, transmitter 109 comprises well known circuitry that utilize the 3GPP communication system protocol. Other possible transmitters include, but are not limited to transmitters utilizing Bluetooth, IEEE 802.11, or HyperLAN protocols. Note that transmission circuitry 109 may perform additional operations on the symbols before they are transmitted over the air. For example, in 3GPP, the symbols go through numerous operations including $1^{st}$ interleaving, radio frame segmentation, transport channel multiplexing, physical channel segmentation, $2^{nd}$ interleaving, physical channel mapping. These operations may change the order of the bits in Q' over the air.

Figure 2:
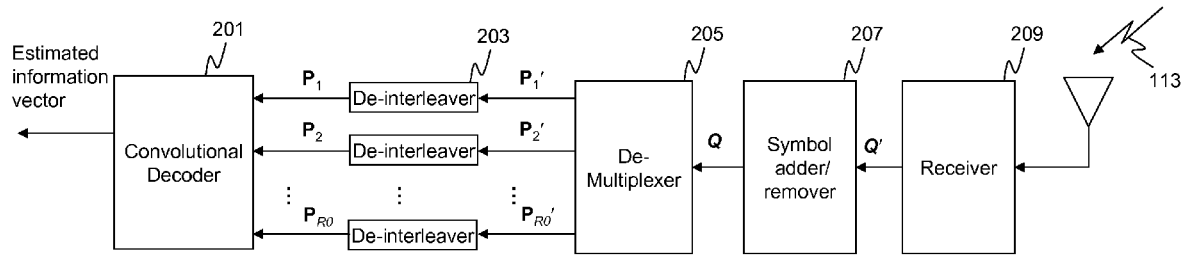
FIG. 2 is a block diagram of a receiver.

FIG. 2 is a block diagram of receiver 200 for receiving over-the-channel transmissions. As shown, receiver 200 comprises convolutional decoder 201, a plurality of (at least one) de-interleavers 203 (only one labeled), a de-multiplexer 205, a symbol adder/remover 207, and a receive circuitry 209.

During operation receive circuitry 209 receives over-the-channel transmission 113. Similar to transmit circuitry 109, receive circuitry 209 comprises common circuitry known in the art for receiving over-the-channel communications utilizing a well known communication protocol, and serve as means for receiving and demodulating symbols. For example, receive circuitry 209 comprises well known circuitry that utilize the 3GPP communication system protocol. Other possible receivers include, but are not limited to receivers utilizing Bluetooth, IEEE 802.11, or HyperLAN protocols.

Once over-the-channel transmission 113 is received, receive circuitry 209 demodulates the received signal and passes a received vector Q' to symbol adder/remover 207. For example, the elements of the received vector Q' may represent log-likelihood ratios (LLRs). As discussed above, since over-the-channel transmission rates may differ from $R_0*x$ ksymbol/second, received vector Q' may have been modified to match the over-the-channel transmission rate. Because of this, the received vector Q' is input into symbol adder/remover 207 to produce a received vector Q which has a rate of $R_0*x$. The symbol adder/remover 207 maps elements of the received vector Q' to the received vector Q starting at position $L_i$. If received vector Q' has a length of $N_c$ and $N_c$ is less than $R_0*K$, $R_0*K-N_c$ null elements (e.g., LLRs corresponding to substantially zero confidence) may be inserted after the $N_c$ elements of Q' are placed into a vector corresponding to Q.

For example, with $L_i=R_0*K/2$, the length of Q' being $N_c=R_0*K/2$, the input of the symbol adder/remover 207 is the received vector Q' with elements labeled Q'(i), $i=1, \ldots, R_0*K/2$. These elements correspond to the multiplexed interleaved symbols in Q with indices $i=R_0*K/2+1, \ldots, R_0*K$. The output vector of 207 can be $[0, 0, \ldots, Q'(1), \ldots, Q'(R_0*K/2)]$, where 0 represents the inserted null elements, such as zero valued LLRs.

If the length of the received vector Q' is greater than $R_0*K$, multiple elements of Q' map into the same location of Q. In this case, those multiple elements may be combined, for example, by adding the LLRs. For example, with $L_i=1$ and the length of Q' being $N_c=\frac{3}{2}*R_0*K$, the input of the symbol adder/remover 207 is received vector of $Q'=[Q'(1), Q'(2), \ldots, Q'(R_0*K), Q'(R_0*K+1), Q'(R_0*K+2), \ldots, Q'(3*R_0*K/2)]$, the output of 207 can be $[Q'(1)+Q'(R_0*K+1), \ldots, Q'(R_0*K/2)+Q'(3*R_0*K/2), Q'(R_0*K/2+1), \ldots, Q'(R_0*K)]$.

In a communication system implementing hybrid automatic repeat request (HARQ), multiple transmissions of the same information vector may occur due to, for example, the unsuccessful decoding (incorrect information vector estimation) of previous transmissions of the same information vector or unsuccessful acknowledgement of the decoding status. In another embodiment of the invention, the output of symbol adder/remover 207 for this reception may be combined with the output of the symbol adder/remover 207 from a previous reception. The combining may happen when the first reception cannot be successfully decoded into a correct information vector estimation. The receiver thus sends an indication that a first vector Q' was improperly received, and requests from the transmitter a second vector Q' also derived from vector Q. The transmitter receives an indication that a first Q' was improperly received; and builds and transmits the second Q' from vector Q. In the case of incremental redundancy, the second Q' may contain symbols from the first Q', though an attempt may be made to minimize the overlap between the first and second Q'. The preferred embodiment is that the second Q' differs from the first Q'. In the case of Chase combining (or partial Chase combining), the second Q' is a subset of or equal to the first Q'. The retransmission request and response may happen several times until the information vector is correctly decoded or a maximum number of transmissions are reached. The received signal vectors Q' from all the transmissions related to the same information vector can be combined in estimating the information vector.

In one example of combining, let $N_c=R_0*K/2$ for both receptions. Let $L_{i-1}=1$ and vector $Q_{i-1}'=[Q(1), Q(2), \ldots, Q(R_0*K/2)]$ was sent for the (i−1)-th transmission. Let $L_i=R_0*K/2+1$ and vector $Q_i'=[Q(R_0=*K/2+1), Q(R_0*K/2+2), Q(R_0*K)]$ be sent for the i-th transmission. The vectors received in the (i−1)-th and the i-th transmission can be combined in 207 to form the vector $Q=[Q_{i-1}', Q_i']=[Q(1), Q(2), \ldots, Q(R_0*K/2), Q(R_0*K/2+1), Q(R_0*K/2+2), \ldots, Q(R_0*K)]$. Incremental redundancy type of combining like this can improve the system performance.

In another example of combining, let $N_c=3*R_0*K/4$ for both transmissions. Let $L_{i-1}=1$ and vector $Q_{i-1}'=[Q_{i-1}'(1), Q_{i-1}'(2), \ldots, Q_{i-1}'(3*R_0*K/4)]$ be sent for the (i−1)-th transmission. Vector $Q_i'$ corresponds to the first $3*R_0*K/4$ elements of Q. Let $L_i=N_c$ and vector $Q_i'=[Q_i'(1), Q_i'(2), \ldots, Q_i'(3*R_0*K/4)]=[Q(3*R_0*K/4+1), \ldots, Q(R_0*K), Q(1), Q(2), \ldots, Q(R_0*K/2)]$ be sent for the i-th transmission. The (i−1)-th and the i-th transmission can be combined at the receiver to form a vector $[Q_{i-1}'(1)+Q_i'(R_0*K/4+1), Q_{i-1}'(2)+Q_i'(R_0*K/4+2), \ldots, Q_{i-1}'(R_0*K/2)+Q_i'(3*R_0*K/4), Q_{i-1}'(R_0*K/2+1), \ldots, Q_{i-1}'(3*R_0*K/4), Q_i'(1), \ldots, Q_i'(R_0*K/4)]$. In the discussion above, it is assumed that if the same indexed symbol (for Q) is received multiple times at the receiver (from the same transmission or from multiple transmissions), the received values are combined via addition. However, other types of code combining are possible, e.g., maximum-ratio combining, equal-gain combining.

Once symbol adder/remover 207 has produced the received vector corresponding to Q, the vector is output to de-multiplexer 205 where it is de-multiplexed to produce received vectors corresponding to $P_0', P_1', \ldots, P_{RO}'$. Each vector $P_0', P_1', \ldots, P_{RO}'$ is input into de-interleaver 203 (which may be the same or differing de-interleavers 203), and received vectors $P_0, P_1, \ldots, P_{RO}$ are output from de-interleavers 203. Received vectors corresponding to $P_0, P_1, \ldots, P_{RO}$ are then input into convolutional decoder 201 and appropriately decoded to produce the estimated information vector.

Figure 3:
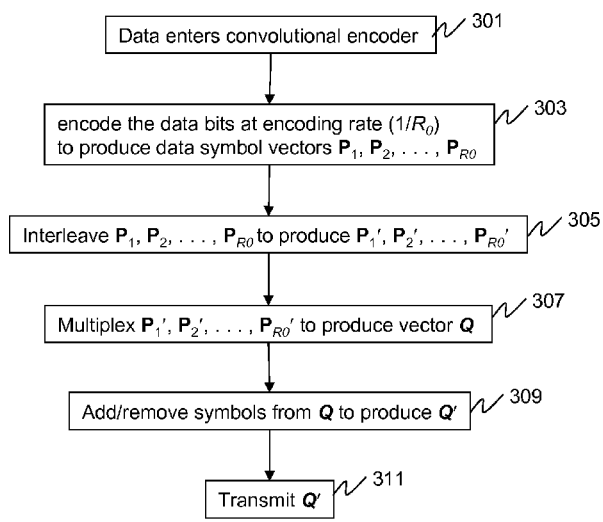
FIG. 3 is a flow chart showing operation of the transmitter of FIG. 1.

FIG. 3 is a flow chart showing operation of the transmitter of FIG. 1. The logic flow begins at step 301 where data represented by an information vector of length K enters convolutional encoder 101. Encoder 101 encodes information bits from the information vector at encoding rate ($R_0$) to produce data symbol vectors $P_1, P_2, \ldots, P_{RO}$ (step 303). Vectors $P_1, \ldots, P_{RO}$ are input into interleavers 103 and vectors $P_1', P_2', \ldots, P_{RO}'$ are output by interleavers 103 at the same data symbol rate that they were input (e.g., x ksymbol/second rate) (step 305). As discussed, each vector $P_1, \ldots, P_{RO}$ is interleaved separately. This may entail using differing interleavers on each $P_1, \ldots, P_{RO}$.

Interleaved data symbols $P_1', P_2', \ldots, P_{RO}'$ are output from each interleaver at x ksymbol/second, and enter multiplexer 105 where they are multiplexed to produce vector Q (step 307). The multiplexed interleaved symbols Q are input into symbol adder/remover 107 where appropriate symbols are added or removed to match the over-the-channel transmission rate, producing Q' (step 309). Finally, at step 311 vector Q' is passed to transmission circuitry 109 where it is transmitted via over-the-channel transmission 113. In the case that Q' is greater than Q (i.e., the target rate of 1/R is lower than the mother code rate $1/R_0$), the bits from Q may be repeated $t=\lfloor R/R_0 \rfloor$ times, with the remainder covering $(R-R_0 t)K$ trellis sections, approximately evenly distributed over the entire trellis.

Figure 4:
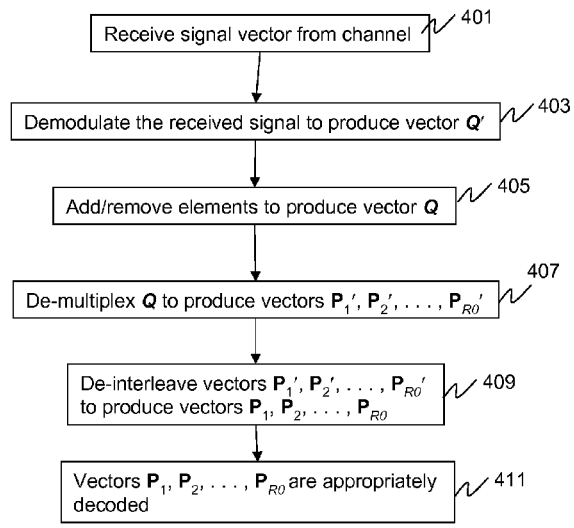
FIG. 4 is a flow chart showing operation of the receiver of FIG. 3.

FIG. 4 is a flow chart showing operation of the receiver of FIG. 2. Receiver 200 estimates the information vector from the received signal vector Q'. At step 401 receive circuitry 209 receives over-the-channel transmission 113. Once over-the-channel transmission 113 is received, receive circuitry 209 demodulates the received signal to produce vector Q' (step 403) and passes vector Q' to symbol adder/remover 207 where the appropriate elements, such as bits for a hard decision decoder or log-likelihood ratios (LLRs) for a soft decision decoder, are inserted/combined to produce vector Q (step 405). Once symbol adder/remover 207 has produced vector Q, the vector is output to de-multiplexer 205 where it is de-multiplexed to produce vectors $P_1', P_2', \ldots, P_{RO}'$ (step 407). Each vector $P_1', P_2', \ldots, P_{RO}'$ is input into de-interleaver 203 (which may be the same or differing de-interleavers 203) where vectors $P_1, P_2, \ldots, P_{RO}$ are produced (step 409) by de-interleaving vectors $P_1', P_2', \ldots, P_{RO}'$. At step 411 vectors $P_1, P_2, \ldots, P_{RO}$ are input into convolutional decoder 201 and appropriately decoded to produce the estimation of the information vector, which has a length K. In the above the vector in the receiver that corresponds to the vector in the transmitter is labeled with the same variable, such as Q.

The transmitter and receiver methods described above offer benefits when used with convolutional codes. First, the output streams from the convolutional encoder are of equal importance in a trellis-based decoder, and are therefore treated the same in the rate-matching procedure. In particular, approximately the same number of bits may be sent from each parity stream. This is in contrast to a turbo code, where in the iterative decoding process the information stream (systematic bits) is prioritized, and therefore may be sent before the remaining parity streams are sent. For example, with a R=¾ code and 300 information bits, a turbo code may send 290 information bits from the information stream and 110 bits in total from other parity streams. Using the above methods with $R_0=3$ and with a target ¾ code and 300 information bits, approximately 133 bits are taken from each of three streams (the first of which may be an information stream if the code is systematic). Second, with a convolutional code, punctured parity positions (i.e., bits not selected from Q to be in Q') should be distributed as much as possible on different trellis sections in the decoder. In the above methods, this distribution may be accomplished by using a different interleaver for each parity stream, as will be described in more detail below. With a turbo code, iterative decoding is possible as long as parity bits from each constituent code are available; iterative decoding makes the code less sensitive to the individual locations of punctured parity positions.

In one example, the steps of interleaving vectors $P_1, P_2, \ldots, P_{RO}$ (each of length K) separately and then multiplexing them can be achieved using an equivalent interleaver that interleaves a concatenated vector of length $R_0*K$. The concatenated vector is formed by concatenating $P_1, P_2, \ldots, P_{RO}$.

In another example, the procedures (interleaving, multiplexing, adding/removing symbols from Q) to determine vector Q' can be achieved equivalently by selecting the appropriate symbols from each vector $P_1, P_2, \ldots, P_{RO}$.

The descriptions above have assumed that the convolutional code produces $R_0$ output symbols per each information bit. One of ordinary skill the art will recognize that the mother code rate of the convolutional code can be $A/R_0$, A is a positive integer, i.e., $R_0$ output symbols are generated for every A input information bits.

While a simple form for interleaving was described above, one of ordinary skill in the art will recognize that other forms of interleaving may be used. For example, a sub-block of symbols (P) to be interleaved can be written into an array at addresses from 0 to the number of the symbols minus 1, (K−1), and the interleaved symbols can then be read out in a permuted order with the i-th symbol being read from an address $AD_i$ (i=0, . . . , K−1), as follows:

1. Determine the sub-block interleaver parameters, M and J.
2. Initialize counters i and j to 0.
3. Find the tentative output address $$T_j=2^M(j \bmod J)+BRO_M((\lfloor j/J \rfloor+\Delta) \bmod 2^M), 0 \leq \Delta \leq 2^M-1,$$

where $BRO_M(y)$ indicates the symbol-reversed M-symbol value of y. When the code rate is $1/R_0$, for sub-block s, $\Delta=\lceil (s-1)*2^M/R_0 \rceil$, s=1, . . . , $R_0$.

4. If $T_j$ is less than K, then $AD_i=T_j$, and increment i and j by 1. Otherwise discard $T_j$ and increment j only.

5. Repeat steps 3 and 4 until all interleaver output addresses $AD_i$ (i=0, ..., K−1) are obtained.

Figure 5:
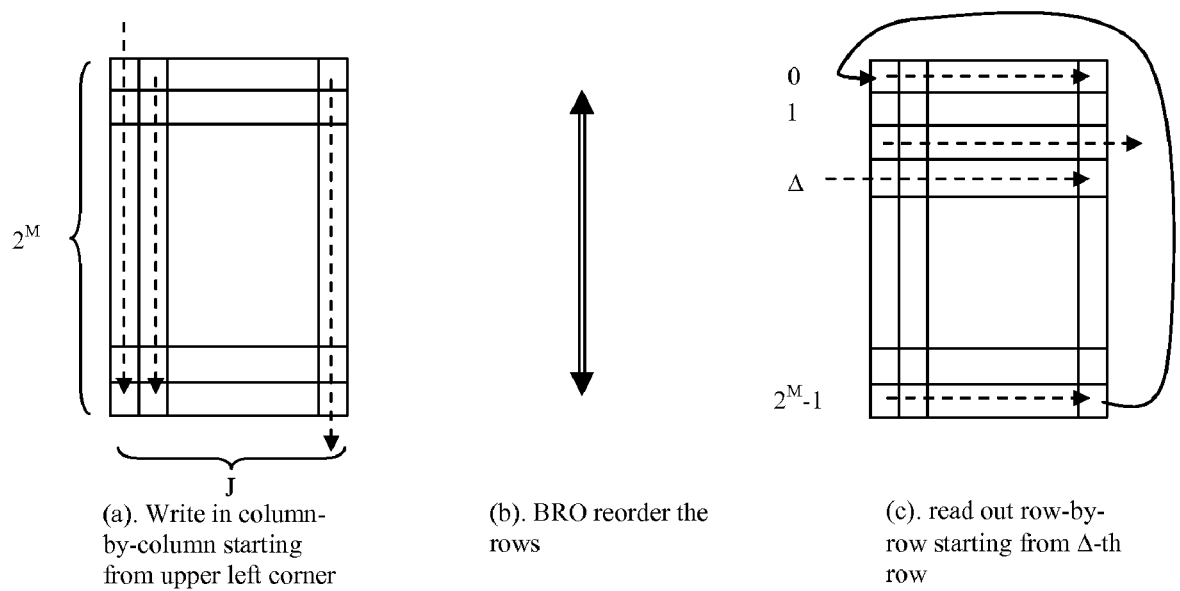
FIG. 5 illustrates interleaving.

If $K'=2^M \times J$, the interleaving function in step 3 can be interpreted as (a) writing a sequence 0 to K'−1 into a table of $2^M$ rows and J columns in a column-by-column manner, starting from the upper-left corner (row index=0, column index=0); (b) $BRO_M$ function reorders the rows of the table; (c) reading out row-by-row starting from the Δ-th row, wrapping around to the first row if $\Delta \geq 2^M$. The read-out sequence is the $\{T_j\}$ sequence. These three steps are illustrated in FIG. 5.

The parameters M and J can be determined using simple rules. For example, $J=1, M=\lceil \log_2(K) \rceil$, if $K \leq 64$;

$J=2, M=\lceil \log_2(K/2) \rceil$, otherwise.

By using a different Δ value for different symbol streams (which results in different interleavers 103 (and de-interleavers 203 corresponding to 103)), it ensures that the adjacent symbols in sequence Q, $[P_1'(i), P_2'(i)]$ for $1/R_0=\frac{1}{2}$ (or $[P_1'(i), P_2'(i), P_3'(i)]$ for $1/R_0=\frac{1}{3}$), are from different trellis sections of the convolutional code. The use of a different Δ value for different symbol streams minimizes the opportunities of puncturing data symbols from the same trellis section, and it spreads out the punctured symbols on a given data symbol stream.

The scheme above has the advantage of simplicity and efficiency compared to a scheme using puncturing patterns. By taking the needed number of symbols from Q, code rate of any granularity can be achieved. Retransmission for IR can be achieved by choosing symbols from Q that have minimum overlap from previous transmissions. The error-correcting performance is improved by sending data symbols that are evenly distributed over the code trellis.

Unlike puncturing patterns, the scheme is also flexible with different information vector lengths. This is achieved by defining a sub-block interleaving method which is flexible with vector lengths. For example, if only sub-block interleaving of discrete sizes are defined, then filler bits such as zeros may be padded to each stream before sub-block interleaving. Those filler bits may be discarded after sub-block interleaving.

While the invention has been particularly shown and described with reference to a particular embodiment, it will be understood by those skilled in the art that various changes in form and details may be made therein without departing from the spirit and scope of the invention. For example, the sub-block interleavers shown above are just examples. Other interleaving definitions may be used. It is intended that such changes come within the scope of the following claims.

The invention claimed is:

1. A method for operating a transmitter, the method comprising the steps of:

encoding an information vector to produce data symbol vectors $P_1, P_2, \ldots, P_{RO}$;

interleaving vectors $P_1, \ldots, P_{RO}$ to produce vectors $P_1', P_2', \ldots, P_{RO}'$, wherein each vector $P_1, \ldots, P_{RO}$ is interleaved separately;

multiplexing vectors $P_1', P_2', \ldots, P_{RO}'$ to produce vector Q;

adding or removing symbols from Q to form a vector Q' having a rate that matches an over-the-channel transmission rate, where Q' comprises symbols from each vector $P_i'$, i=1, 2, ..., $R_0$; and transmitting vector Q' over-the-channel;

wherein the step of interleaving vectors $P_1, \ldots, P_{RO}$ comprising the step of using an interleaver for $P_i$ which is different from an interleaver used for $P_j$, for interleaving certain i≠j, $1 \leq i, j \leq R_0$.

2. The method of claim 1 wherein vectors $P_1, P_2, \ldots, P_{RO}$ are parity vectors, not equal to the information vector.

3. The method of claim 1 wherein the step of interleaving vector $P_s$, $1 \leq s \leq R_0$, comprises the steps of:

writing a vector into an array at addresses from 0 to K minus 1, (K−1), wherein K is a length of the information vector; and reading interleaved symbols out in a permuted order with an i-th symbol being read from an address $AD_i$ (i=0, ..., K−1) via the following steps:

1) determining sub-block interleaver parameters, M and J;

2) initializing i and j to 0;

3) finding a tentative output address $T_j=2^M(j \bmod J)+BRO_M((\lfloor j/J \rfloor+\Delta) \bmod 2^M)$,
$0 \leq \Delta \leq 2^M-1$, where $BRO_M(y)$ indicates a symbol-reversed M-symbol value of y, and for sub block s, $\Delta=\lceil (s-1)*2^M/R_0 \rceil$, s=1, ..., $R_0$ and 4) having $AD_i=T_j$ and incrementing i and j by 1 if $T_j$ is less than K; otherwise $T_j$ is discarded and j is incremented by one;

5) repeating steps 3 and 4 until all interleaver output addresses $AD_i$ (i=0, ..., K−1) are obtained.

4. The method of claim 1 wherein Q=$[P_1'(1), P_2'(1), \ldots, P_{RO}'(1), P_1'(2), P_2'(2), \ldots, P_{RO}'(2), \ldots, P_1'(K), P_2'(K), \ldots, P_{RO}'(K)]$, wherein K is a length of the information vector.

5. The method of claim 1 wherein Q=$[P_1'(1), P_1'(2), P_2'(1), P_2'(2), \ldots, P_{RO}'(1), P_{RO}'(2), P_1'(3), P_1'(4), P_2'(3), P_2'(4), \ldots, P_{RO}'(3), P_{RO}'(4), \ldots, P_1'(K-1), P_1'(K), P_2'(K-1), P_2'(K), \ldots, P_{RO}'(K-1), P_{RO}'(K)]$, wherein K is a length of the information vector.

6. The method of claim 1 further comprising the step of:

receiving an indication that a first Q' was improperly received; and deriving and transmitting a second Q' from vector Q.

7. The method of claim 6 wherein the second Q' differs from the first Q'.

8. The method of claim 6 wherein the second Q' is a subset of or equal to the first Q'.

9. A method for operating a receiver that estimates an information vector, the method comprising the steps of:

receiving a signal vector Q' over-the-channel, where Q' comprises symbols from each vector $P_i'$, i=1, 2, ..., $R_0$;

adding or removing symbols from Q' to form a vector Q;

de-multiplexing vector Q to produce a plurality of vectors $P_1', P_2', \ldots, P_{RO}'$;

de-interleaving $P_1', P_2', \ldots, P_{RO}'$ to produce vectors $P_1, \ldots, P_{RO}$, wherein each vector $P_1', P_2', \ldots, P_{RO}'$ is de-interleaved separately; and decoding $P_1', P_2', \ldots, P_{RO}'$ to produce the estimated information vector;

wherein the step of de-interleaving vectors $P_1', P_2', \ldots, P_{RO}'$ comprises the step of using a de-interleaver for $P_i$ which is different from an de-interleaver used for de-interleaving $P_j$, for certain i≠j, $1 \leq i, j \leq R_0$.

10. The method of claim 9 wherein symbol vectors $P_1, P_2, \ldots, P_{RO}$ are parity vectors, not equal to the information vector.

11. The method of claim 9 wherein Q=[$P_1'(1), P_2'(1), \ldots, P_{R0}'(1), P_1'(2), P_2'(2), \ldots, P_{R0}'(2), \ldots, P_1'(K), P_2'(K), \ldots, P_{R0}'(K)$], wherein K is a length of the estimated information vector.

12. The method of claim 9 further comprising the steps of:
sending an indication that a first vector Q' was improperly received; and
requesting from a transmitter a second vector Q' also derived from vector Q.

13. An apparatus comprising:
an encoder encoding an information vector to produce data symbol vectors $P_1, P_2, \ldots, P_{R0}$;
at least one interleaver for interleaving vectors $P_1, \ldots, P_{R0}$ to produce vectors $P_1', P_2', \ldots, P_{R0}'$, wherein each vector $P_1, \ldots, P_{R0}$ is interleaved separately;
a multiplexer multiplexing vectors $P_1', P_2', \ldots, P_{R0}'$ to produce vector Q;
a symbol adder/remover adding or removing symbols from Q to form a vector Q' having a rate that matches an over-the-channel transmission rate, where Q' comprises symbols from each vector $P_i'$, i=1, 2, ..., $R_0$; and
a transmitter transmitting vector Q' over-the-channel;
wherein the at least one interleaver comprises an interleaver used for interleaving $P_i$ which is different from the interleaver used for interleaving $P_j$, for certain i≠j, 1≦i, j≦$R_0$.

14. The apparatus of claim 13 wherein Q=[$P_1'(1), P_2'(1), \ldots, P_{R0}'(1), P_1'(2), P_2'(2), \ldots, P_{R0}'(2), \ldots, P_1'(K), P_2'(K), \ldots, P_{R0}'(K)$], wherein K is a length of the information vector.

15. An apparatus comprising:
a receiver receiving vector Q' over-the-channel, where Q' comprises symbols from each vector $P_i'$, i=1, 2, ..., $R_0$;
a symbol adder/remover adding or removing symbols from Q' to form a vector Q;
a de-multiplexer de-multiplexing vector Q to produce a plurality of vectors $P_1', P_2', \ldots, P_{R0}'$;
at least one de-interleaver de-interleaving $P_1', P_2', \ldots, P_{R0}'$ to produce vectors $P_1, \ldots, P_{R0}$, wherein each vector $P_1', P_2', \ldots, P_{R0}'$ is de-interleaved separately; and
a decoder decoding $P_1, P_2, \ldots, P_{R0}$ to produce an estimated information vector;
wherein the at least one de-interleaver comprises a de-interleaver used for interleaving $P_i$ which is different from the interleaving used for interleaving $P_j$, for certain i≠j, 1≦i, j≦$R_0$.

16. The apparatus of claim 15 wherein Q=[$P_1'(1), P_2'(1), \ldots, P_{R0}'(1), P_1'(2), P_2'(2), \ldots, P_{R0}'(2), \ldots, P_1'(K), P_2'(K), \ldots, P_{R0}'(K)$], wherein K is a length of the estimated information vector.

* * * * *

UNITED STATES PATENT AND TRADEMARK OFFICE
CERTIFICATE OF CORRECTION

| | | |
|---|---|---|
| PATENT NO. | : 7,475,330 B2 | Page 1 of 1 |
| APPLICATION NO. | : 11/466926 | |
| DATED | : January 6, 2009 | |
| INVENTOR(S) | : Yufei Wu Blankenship et al. | |

It is certified that error appears in the above-identified patent and that said Letters Patent is hereby corrected as shown below:

In Column 6, Lines 26-46, delete "Finally, vector Q' is passed...over the air" and insert the same in line 27, as a new paragraph.

In Column 7, Line 4, delete "Vector $Q_i$'" and insert -- Vector $Q_{i-1}'$ --, therefor.

Signed and Sealed this

Fourth Day of August, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,475,330 B2
APPLICATION NO. : 11/466926
DATED : January 6, 2009
INVENTOR(S) : Yufei Wu Blankenship, Brian K. Classon and Vipul A. Desai It is certified that error appears in the above-identified patent and that said Letters Patent is hereby corrected as shown below:

IN THE CLAIMS

In Column 10, Line 3, Claim 1, delete the word "interleaving".

Signed and Sealed this

First Day of September, 2009

David J. Kappos
*Director of the United States Patent and Trademark Office*